(12) United States Patent
Teplin et al.

(10) Patent No.: US 8,987,115 B2
(45) Date of Patent: Mar. 24, 2015

(54) EPITAXIAL GROWTH OF SILICON FOR LAYER TRANSFER

(75) Inventors: Charles Teplin, Boulder, CO (US); Howard M. Branz, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 341 days.

(21) Appl. No.: 13/059,830

(22) PCT Filed: Aug. 21, 2008

(86) PCT No.: PCT/US2008/073834
§ 371 (c)(1),
(2), (4) Date: Feb. 18, 2011

(87) PCT Pub. No.: WO2010/021623
PCT Pub. Date: Feb. 25, 2010

(65) Prior Publication Data
US 2011/0146791 A1    Jun. 23, 2011

(51) Int. Cl.
*H01L 21/30* (2006.01)
*H01L 21/02* (2006.01)
*H01L 31/18* (2006.01)

(52) U.S. Cl.
CPC .... *H01L 21/02488* (2013.01); *H01L 21/02381* (2013.01); *H01L 21/02532* (2013.01); *H01L 21/02664* (2013.01); *H01L 31/1804* (2013.01);
(Continued)

(58) Field of Classification Search
CPC ............... H01L 21/76254; H01L 21/02532; H01L 21/76259; H01L 21/02381; H01L 21/76251; H01L 21/0245; H01L 21/0262; H01L 21/2007; H01L 27/1214; H01L 2924/00; H01L 2224/32225; H01L 2224/48227; H01L 2924/10253; H01L 21/0237; H01L 21/02057; H01L 24/05

USPC ............. 138/258; 438/458; 136/258; 257/75, 257/E21.133, E29.003, E31.041
See application file for complete search history.

(56) References Cited

U.S. PATENT DOCUMENTS 5,308,788 A * 5/1994 Fitch et al. ...................... 117/86
5,695,557 A   12/1997 Yamagata et al.
(Continued)

FOREIGN PATENT DOCUMENTS

JP        05-221797 A      8/1993
KR   10-2006-0020427 A    3/2006

OTHER PUBLICATIONS

IPRP and WO of the International Search Report dated Apr. 23, 2009, for International Application No. PCT/US08/73834.

*Primary Examiner* — Duy T Nguyen
(74) *Attorney, Agent, or Firm* — John C. Stolpa; Michael A. McIntyre

(57) ABSTRACT

Methods of preparing a thin crystalline silicon film for transfer and devices utilizing a transferred crystalline silicon film are disclosed. The methods include preparing a silicon growth substrate which has an interface defining substance associated with an exterior surface. The methods further include depositing an epitaxial layer of silicon on the silicon growth substrate at the surface and separating the epitaxial layer from the substrate substantially along the plane or other surface defined by the interface defining substance. The epitaxial layer may be utilized as a thin film of crystalline silicon in any type of semiconductor device which requires a crystalline silicon layer. In use, the epitaxial transfer layer may be associated with a secondary substrate.

21 Claims, 7 Drawing Sheets

(52) U.S. Cl.
CPC ........... *H01L 21/0262* (2013.01); *Y02E 10/547* (2013.01)
USPC .................................. 438/458; 257/E21.133

(56) References Cited

U.S. PATENT DOCUMENTS

| | | | |
|---|---|---|---|
| 6,251,183 | B1 | 6/2001 | Iwancizko et al. |
| 6,331,208 | B1 * | 12/2001 | Nishida et al. ................... 117/89 |
| 6,472,276 | B1 | 10/2002 | Hilt et al. |
| 6,569,748 | B1 * | 5/2003 | Sakaguchi et al. ............ 438/455 |
| 7,601,215 | B1 | 10/2009 | Wang et al. |
| 2002/0195057 | A1 | 12/2002 | Droopad et al. |
| 2003/0008480 | A1 | 1/2003 | Takeno et al. |
| 2003/0015719 | A1 * | 1/2003 | Haga ................................ 257/82 |
| 2003/0020114 | A1 | 1/2003 | Yu et al. |
| 2003/0021014 | A1 | 1/2003 | Barenburg et al. |
| 2003/0035636 | A1 | 2/2003 | Hansen et al. |
| 2003/0056718 | A1 | 3/2003 | Kawahara et al. |
| 2003/0089921 | A1 | 5/2003 | Jordan et al. |
| 2004/0198026 | A1 * | 10/2004 | Chu et al. ....................... 438/479 |
| 2006/0130736 | A1 | 6/2006 | Takeno |
| 2006/0138392 | A1 | 6/2006 | Bowden et al. |
| 2006/0234474 | A1 * | 10/2006 | Nastasi et al. ................. 438/458 |
| 2007/0281172 | A1 * | 12/2007 | Couillard et al. ............. 428/446 |
| 2007/0298591 | A1 * | 12/2007 | Cha ................................ 438/478 |
| 2008/0044932 | A1 * | 2/2008 | Samoilov et al. .................. 438/5 |

* cited by examiner

EPITAXIAL GROWTH OF SILICON FOR LAYER TRANSFER

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

RELATED APPLICATION DATA

The present application is a national phase pursuant to 35 USC §371 of International Patent application Ser. No. PCT/US2008/073834, filed Aug. 21, 2008, which application is incorporated herein by reference in its entirety.

BACKGROUND

Various types of semi-conductor devices may be fabricated utilizing a crystalline silicon substrate. One such type of device is a silicon solar cell also known as a photovoltaic cell which generates electrical power when exposed to solar radiation from the sun. Other classes of semi-conductor devices which may be fabricated using a crystalline silicon substrate include, but are not limited to, integrated circuit devices such as transistors, photonic devices, piezoelectronic devices, flat panel displays, micro-electromechanical systems, nanotechnology structures and similar components.

Crystalline silicon is generally available in the form of wafers provided in various sizes and thicknesses. The wafers are initially prepared from larger silicon boules. A typical wafer may have a thickness of between about 150 μm to 925 μm. For large-area semiconductor devices such as photovoltaics, the cost of the crystalline silicon substrate is very high. Many such devices may be effectively implemented with a layer of crystalline silicon which is substantially thinner than typical wafer thicknesses. Accordingly, several methods of forming or growing a thinner film of crystalline silicon have been developed.

For example, techniques have been developed for the epitaxial growth of highly ordered crystalline silicon on non-silicon substrates. Epitaxial growth on a non-crystalline substrate is technically challenging since a specialized template or other method must be implemented to guide formation of high-quality silicon on an amorphous or polycrystalline substrate. In addition, many substrates which are good insulators, inexpensive and otherwise desirable, cannot withstand the high temperatures associated with many methods of epitaxial crystalline silicon deposition. It is important to note that a thin film of crystalline silicon must be associated with a substantially more robust and ideally significantly less expensive substrate as a part of the device fabrication process. Naturally, this association occurs automatically if a thin silicon film is grown on the selected substrate, however, for certain devices it may be advantageous to transfer a thin film of crystalline silicon to the secondary substrate after the film has been formed.

Various methods for preparing and transferring a thin film of crystalline silicon have been developed. In one method, particles such as hydrogen, helium or other compounds may be energetically implanted at a selected depth in crystalline silicon substrate material, a wafer for example. For example, hydrogen ions may be selectively implanted into a silicon wafer to a depth of up to about 0.5 μm and with accuracy of about +/−0.05 μm using available ion implantation methods.

The implanted particles serve to add stress or otherwise reduce the fracture energy along a plane parallel to the top surface of the substrate at the selected implantation depth. This fabricated stress plane allows for a controlled cleave along the implanted ion plane to remove a thin layer of silicon. The cleaving process itself may be initiated using mechanical, thermal, or optical energy. Before or after the thin film of crystalline silicon is cleaved from the substrate the film may be bound to a secondary substrate, processed or otherwise used for device fabrication.

The ion implementation method of setting a cleavage or fracture zone at a selected depth within the original substrate necessarily causes a portion of the substrate which is equal to or greater in thickness to the removed film to be irretrievably utilized. Accordingly, any selected substrate has a finite number of thin films of crystalline silicon which may be removed before all available material has been utilized. In addition, this method relies upon ion implantation which can be expensive. Furthermore, ion implantation does not leave a perfectly uniform layer of hydrogen or other implanted ion at the cleavage depth. Thus, the surface of the removed thin film may be rough and require subsequent polishing, annealing or cleaning steps. The ion implantation method of fabricating a thin film of silicon may result in a surface roughness having features that are less than about 60 to 20 nm Subsequent polishing steps may be desirable after a thin film is prepared by the ion implantation method. Finally, the ultimate thickness of the transferred thin film is dependent upon the ability of the ion implantation process to be precise. The depth resolution of implantation becomes progressively less accurate as the depth is increased. Accordingly, thin films prepared and transferred by an ion implantation method are impractical at thicknesses greater than 0.5 μm. Furthermore, the ions passing through the layer to be transferred create some damage in the perfect Si wafer which must be healed through annealing. This anneal step can limit the types of substrate to which the layer is transferred, in particular, the secondary substrate must be able to withstand the anneal temperature.

Various techniques for the preparation and transfer of crystalline thin film silicon for solar cells are known. For example, a porous silicon process (PSI) which starts with formation by electrochemical or other means of a porous silicon layer at the surface of a silicon wafer. Next the sample is annealed or otherwise caused to develop a surface which is suitable for subsequent epitaxy. A silicon film is then grown epitaxially on the porous substrate. After device fabrication a carrier glass may be attached to the front surface of the epitaxial layer and mechanical stress is used to split the resulting thin film from the substrate at the buried high porosity layer within the substrate. This technique relies upon the preparation of a substrate having low surface porosity and a high porosity at a selected depth which both permits high quality epitaxial growth and also facilitates subsequent detachment of the epitaxial layer. Thus, this method of preparing a thin crystalline silicon film for subsequent transfer has many steps and also utilizes some portion of the thickness of the substrate.

However, the layer transfer concept will only become economically viable for photovoltaic applications if the frequent reuse of the substrate is possible. Any method which inherently results in the loss of a substantial thickness of substrate material is thus economically problematic. The embodiments disclosed herein are directed toward overcoming one or more of the problems identified above.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Methods of preparing a crystalline silicon film are disclosed. Exemplary methods include preparing a silicon growth substrate which has an interface defining substance associated with an exterior surface. The methods further include depositing an epitaxial layer of silicon on the silicon growth substrate at the surface and separating the epitaxial layer from the substrate substantially along the plane or other shape defined by the interface defining substance.

An epitaxial layer prepared as described above may be utilized as a thin film of crystalline silicon in any type of semiconductor device which requires a crystalline silicon layer. In use, the epitaxial transfer layer may be associated with a secondary substrate. The epitaxial layer may be associated with the secondary substrate either before or after separating the epitaxial layer from the growth substrate. Alternatively, the epitaxial layer may be associated with a temporary handle prior to separating the epitaxial layer from the growth substrate. The secondary substrate may be of any suitable material, including but not limited to, a glass, plastic, or ceramic substrate selected for desirable physical or mechanical properties.

Exemplary methods disclosed herein include the use of an interface defining substance to define the interface between the growth substrate and the epitaxial transfer layer grown or deposited upon the growth substrate. The interface defining substance is any element, substance or compound which is not silicon and which is associated with an exterior surface of the growth substrate. As a representative and non-limiting example, the interface defining substance may be the hydrogen atoms of a hydrogen terminated silicon surface which remain after the native oxide is removed from a silicon substrate by etching the substrate in a hydrogen fluoride solution. Alternatively, the interface defining substance may be another selected element such as carbon or oxygen which is intentionally associated with the exterior surface of the growth substrate in a pre-processing step. The interface defining substance is not implanted or formed at any substantial depth within the growth substrate.

Exemplary methods may include depositing the epitaxial transfer layer at a temperature at equal or less than 550° C. Alternatively, the epitaxial layer may initially be deposited at a temperature of equal to or less than 550° C. and subsequently deposited at a temperature greater than the initial temperature.

Exemplary methods disclosed herein may further include other semiconductor device preparation or processing steps. For example, the methods may include but are not limited to depositing an amorphous silicon layer on the epitaxial silicon layer, doping the epitaxial layer or finishing a device in or on the epitaxial layer.

The epitaxial layer may be deposited by hot wire chemical vapor deposition, remote plasma chemical vapor deposition, electron-beam deposition, chemical vapor deposition or any other suitable method of depositing an epitaxial silicon layer.

Exemplary methods disclosed herein feature the growth or deposition of an epitaxial transfer layer upon the exterior surface of a growth substrate. The growth substrate may have a highly polished exterior surface. Accordingly, the surface roughness of the epitaxial transfer layer where separated from the growth substrate may be sufficiently smooth for use without additional surface smoothing steps.

Also disclosed are methods of fabricating a silicon based device which include preparing and processing an epitaxial silicon transfer layer as described above. The silicon based device may be, but is not limited to, a photovoltaic cell.

Alternative embodiments disclosed herein include a semiconductor device which has a secondary matrix and a thin film of crystalline silicon transferred to the secondary matrix from a silicon growth substrate. The thin film of crystalline silicon is prepared by epitaxial deposition on the silicon growth substrate at a surface defined by an interface defining substance. The semiconductor device embodiments may be, but are not limited to, a photovoltaic cell.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in the referenced figures of the drawings. It is intended that the embodiments and figures disclosed herein are to be considered illustrative rather than limiting.

DETAILED DESCRIPTION

Figure 1:
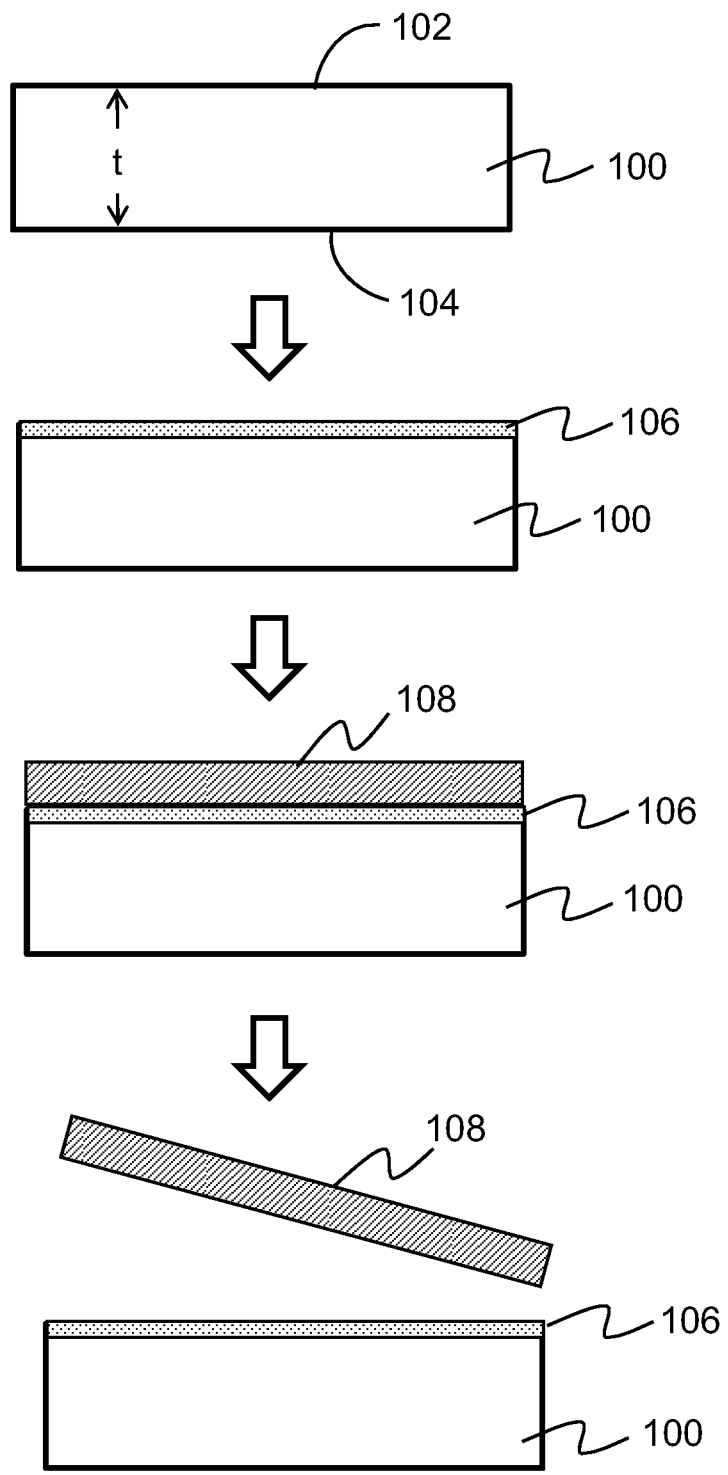
FIG. 1 is a diagrammatic view of the epitaxial growth of a thin crystalline silicon layer for transfer.

The embodiments, methods and devices disclosed herein generally relate to the preparation and use of a thin crystalline silicon film suitable for transfer to a secondary substrate. FIG. 1 is a diagrammatic representation of one embodiment of the methods disclosed herein. As shown in FIG. 1, the method of preparing a crystalline silicon film for layer transfer may be implemented on a crystalline silicon substrate 100. The crystalline silicon substrate 100 may be formed in any desired shape or size but will typically be a readily available monocrystalline silicon wafer. The substrate 100 has a thickness (t) and generally planar exterior surfaces 102 and 104. As illustrated in the second step of FIG. 1, the disclosed methods feature the inclusion of an interface defining substance 106 at one or both of the surfaces 102, 104 of the substrate 100.

As used herein, an interface defining substance 106 is any element, substance or compound which is not silicon and which is associated with an exterior surface of the substrate, 102 or 104. As a representative example, the interface defining substance 106 may be, but is not limited to, the hydrogen molecules of a hydrogen terminated silicon surface which remains after the native oxide ($SiO_2$) is removed from the substrate 100 by etching the substrate 100 in a hydrogen fluoride (HF) solution. Alternatively, the interface defining substance 106 may be another selected element such as carbon or oxygen or molecule such as water or a hydrocarbon which is intentionally or unintentionally associated with the exterior surface 102, 104 in a pre-processing step. The interface defining substance 106 is associated with the surface silicon atoms of the substrate 100. The interface defining substance is not implanted or formed at any substantial depth within the substrate.

The method illustrated in FIG. 1 also includes growing an epitaxial layer of crystalline silicon 108 at the surface 102. Thus the interface defining substance 106 is positioned between the substrate 100 and the epitaxial layer 108. Subsequently, as shown in the fourth step of FIG. 1, the epitaxial layer 108 may be separated from the matrix 100 along the plane defined by the interface defining substance 106. It may be noted from FIG. 1 that the processes described herein result in minimal loss of substrate material since the cleavage plane as defined by the interface defining substance 106 is substantially co-planar with an exterior surface 102, 104 of the substrate 100. Thus, the substrate 100 may be re-used many times.

Growth of the epitaxial layer 108 may be performed by any known technique, for example, by methods such as chemical vapor deposition, including but not limited to, hot wire chemical vapor deposition (HWCVD) and remote plasma chemical vapor deposition, electron-beam deposition, chemical vapor deposition or any other suitable process. Alternative methods of providing for epitaxial silicon growth may be implemented provided the methods do not substantially disturb the interface defining substance 106 present at the surface 102 of the substrate 100 when the epitaxial growth process has commenced and further provided the method makes silicon of satisfactory epitaxial quality when grown over the interface defining substance 106.

Since the preservation of the interface defining substance 106 is important, it may be advantageous to grow the epitaxial layer 108 at a relatively low temperature. Low temperature silicon epitaxy is defined herein as an epitaxial growth process performed at a temperature of less than 550° C. For example, low-temperature HWCVD epitaxy is suitable for use when the interface defining substance 106 is a hydrogen terminated silicon surface. At temperatures above 550° C., the hydrogen layer may be expelled before epitaxial growth commences. Thus, the advantages of maintaining the interface defining substance 106 at the surface 102 as described in detail below would be compromised. Alternative interface defining substances for example carbon or oxygen, may be included on the surface 102 or 104 prior to the growth of an epitaxial layer 108 as described above. Alternative interface defining substances may be more suitable for use with other epitaxial growth strategies, including high temperature methods provided the selected method of epitaxy does not unduly disturb the interface defining substance before epitaxial growth occurs.

Figure 2:
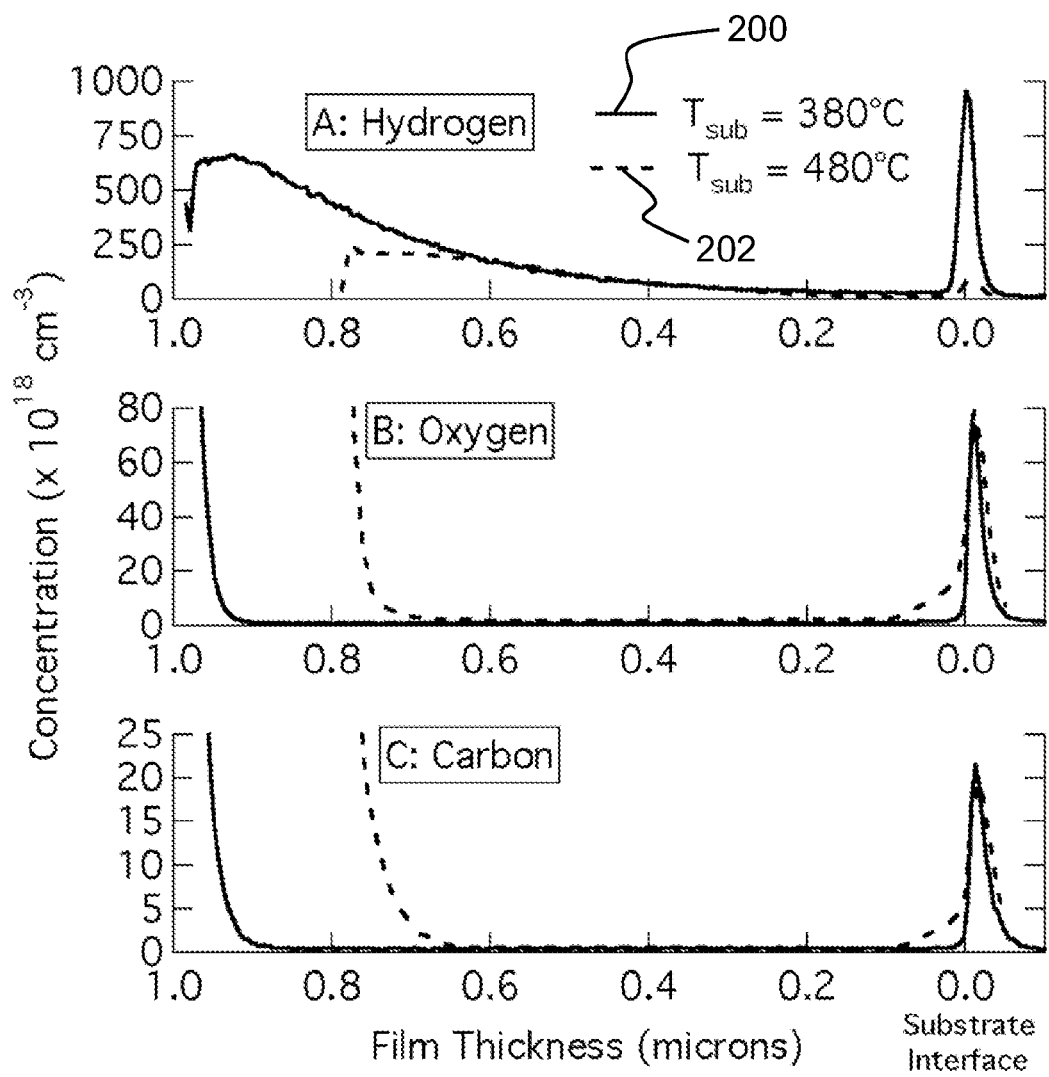
FIG. 2 is a graphical representation of the concentration of selected interface defining substances at the interface between an epitaxially grown transfer layer and a silicon growth substrate.

The suitability of low-temperature HWCVD for the growth of an epitaxial film and maintenance of an interface defining substance 106 as described above is graphically illustrated in FIG. 2. FIG. 2 represents the results of secondary ion mass spectrometry (SIMS) measurements of interface defining substance concentrations at the interface between a crystalline silicon wafer and epitaxial film grown thereupon using low-temperature HWCVD. Prior to epitaxial growth the substrate utilized was prepared to have a hydrogen terminated surface. FIG. 2 includes data 200 for an epitaxial film grown at 380° C. and data 202 for a film grown at 480° C. As shown in FIG. 2 there is a great deal of hydrogen in the form of hydrogen, water or hydrocarbon remaining at the interface between the substrate and epitaxial layer, approximately $10^{15}$ H molecules per cubic centimeter, when processing is carried out at 380° C. FIG. 2 also illustrates that the amount of hydrogen remaining at the interface when processing is carried at 480° C. is reduced but still significant. Also illustrated in FIG. 2 is the concentration of oxygen and carbon at the substrate interface after epitaxial growth has occurred at the above temperatures. It is interesting to note that the relative amount of oxygen and carbon at the interface is not substantially reduced by processing at the higher temperature of 480° C. Accordingly, it is possible that oxygen, carbon, water a hydrocarbon or another substance intentionally or unintentionally associated with the exterior surface of the substrate to create an interface defining substance may be functional even though higher temperature epitaxial deposition methods are utilized.

Figure 3:
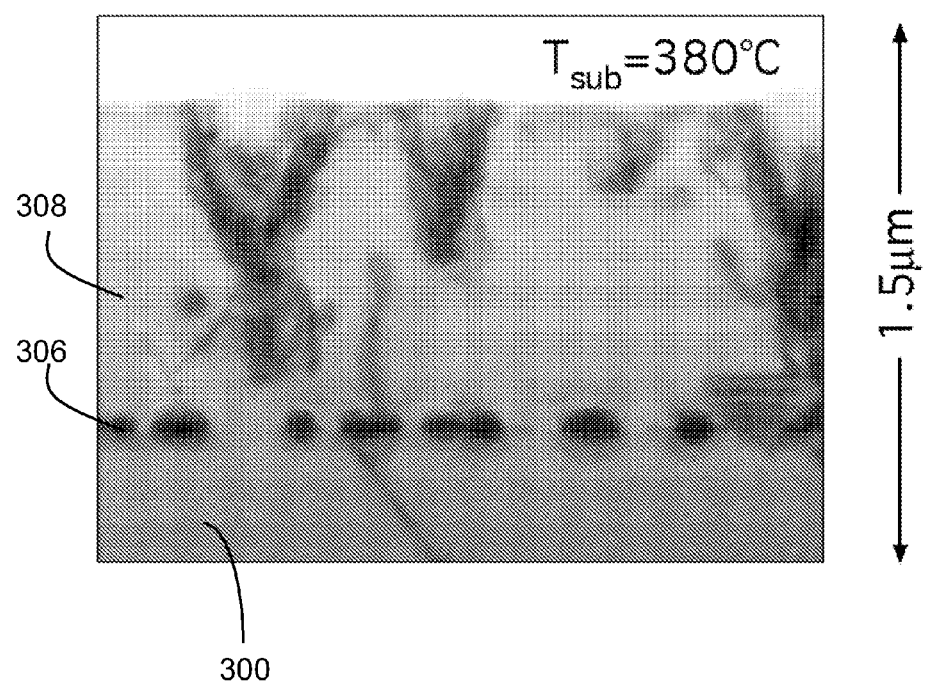
FIG. 3 is a transmission electron microscope image of an epitaxial silicon film and growth substrate where hydrogen is the interface defining substance.

The hydrogen layer (which possibly includes hydrocarbon, water or other strain producing substances at the substrate/epitaxial film interface described above is readily visible in FIG. 3. FIG. 3 is a transmission electron microscope (TEM) image taken of the epitaxial silicon film of FIG. 2 grown at 380° C. As was generally described with respect to FIG. 1, the epitaxial film 308 of FIG. 3 was grown on a crystalline silicon wafer substrate 300 which was prepared with a hydrogen terminated surface by utilization of a liquid HF rinse.

Referring again to FIG. 1, the hydrogen, oxygen, carbon or other interface defining substance 106 at the interface between the substrate 100 and epitaxial layer 108 adds stress and/or reduces the fracture energy along the interface plane. Thus the interface defining substance 106 provides for a controlled cleavage plane along the surface 102. Cleavage may be commenced and sustained by providing mechanical, optical, or thermal cleavage energy to the interface.

The substrate 100 may have a highly polished exterior surface. In addition, the interface defining substance 106 may be applied by a process which does not affect the surface roughness of the exterior surface of the substrate 100. For example, the hydrogen atoms present at the surface of a crystalline silicon substrate when the substrate is prepared to have a hydrogen terminated surface do not substantially change the surface profile of the silicon matrix. Accordingly, the surface roughness of the epitaxial transfer layer 108 at the surface which is cleaved from the matrix 100 may be sufficiently smooth for use without further polishing steps. For example, silicon wafers that have been subjected to initial polishing step may have a surface roughness (Rt) of 4.5-7.0 nm with Rt being defined as the distance between the highest peak and lowest valley within a measurement length. Substrates having a smoother surface roughness may be prepared with subsequent final polishing steps. Generally, a surface roughness Rt of less than 4.0 nm is desirable in a substrate which will be used for the preparation of semiconductor devices.

As described above, the inclusion of an interface defining substance 106 on the substrate 100 does not substantially affect the surface roughness of the growth substrate. Accordingly, an epitaxial layer 108 which is cleaved from a growth substrate 100 at the interface will have a surface roughness which is approximately equal to the surface roughness of the selected substrate 100. Thus, the epitaxial layer 108 may have a surface roughness Rt of less than 7.0 nm, less than 4.5 nm, or less than 4.0 nm on the cleaved surface before further polishing steps. Therefore, an epitaxial transfer layer prepared as described herein may in certain instances be sufficiently smooth for device fabrication without further processing steps.

As described in detail below, the epitaxial layer 108 may be separated from the substrate 100 either before or after the epitaxial layer 108 is associated with a secondary substrate. Similarly, separation may occur before or after further processing is performed on the epitaxial layer 108. For example, initial epitaxial growth may be provided by low-temperature chemical vapor deposition to preserve the integrity and density of the interface defining substance 106 at the matrix surface 102, however subsequent epitaxial growth may be performed at a higher temperature or by a different method so to avoid the epitaxy failure which may occur when low-temperature processes are used to form relatively thick layers. Higher temperature processes may be used after the initial low temperature deposition has preserved the interface defining substance to achieve more rapid deposition or higher quality epitaxy. The initial epitaxial layer or any subsequently formed layer may be doped with any suitable dopant including, but not limited to, boron, phosphorous, aluminum or arsenic. Initial crystal silicon grown epitaxially as described herein may be overlaid by amorphous silicon growth. In addition, device fabrication steps including but not limited to various lithographic steps or metal contact deposition may be performed prior to or after the separation of the epitaxial layer 108 from the substrate 100.

Figure 4:
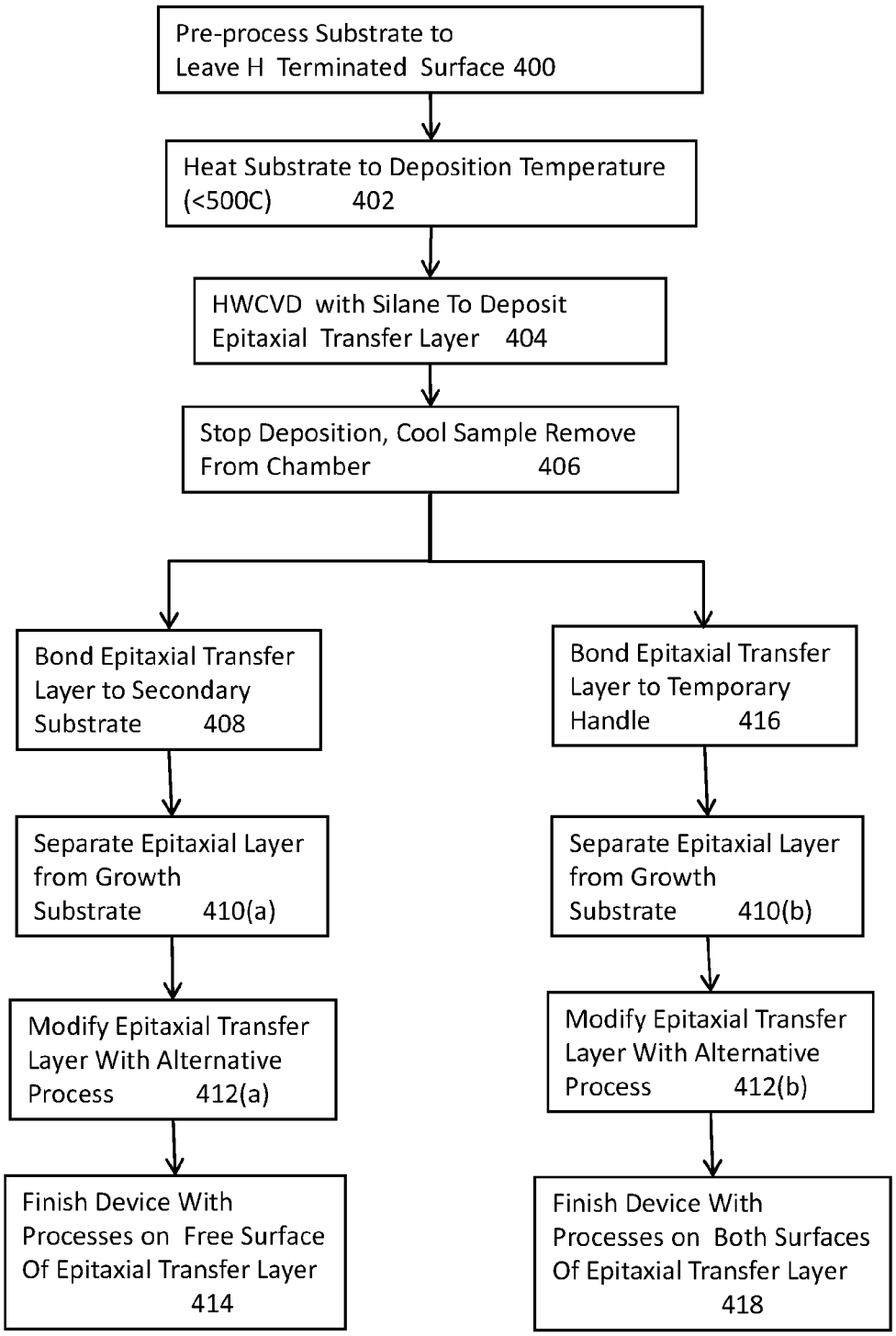
FIG. 4 is a flow chart illustrating methods of preparing an epitaxial transfer layer and preparing a device using the epitaxial transfer layer.
Figure 5:
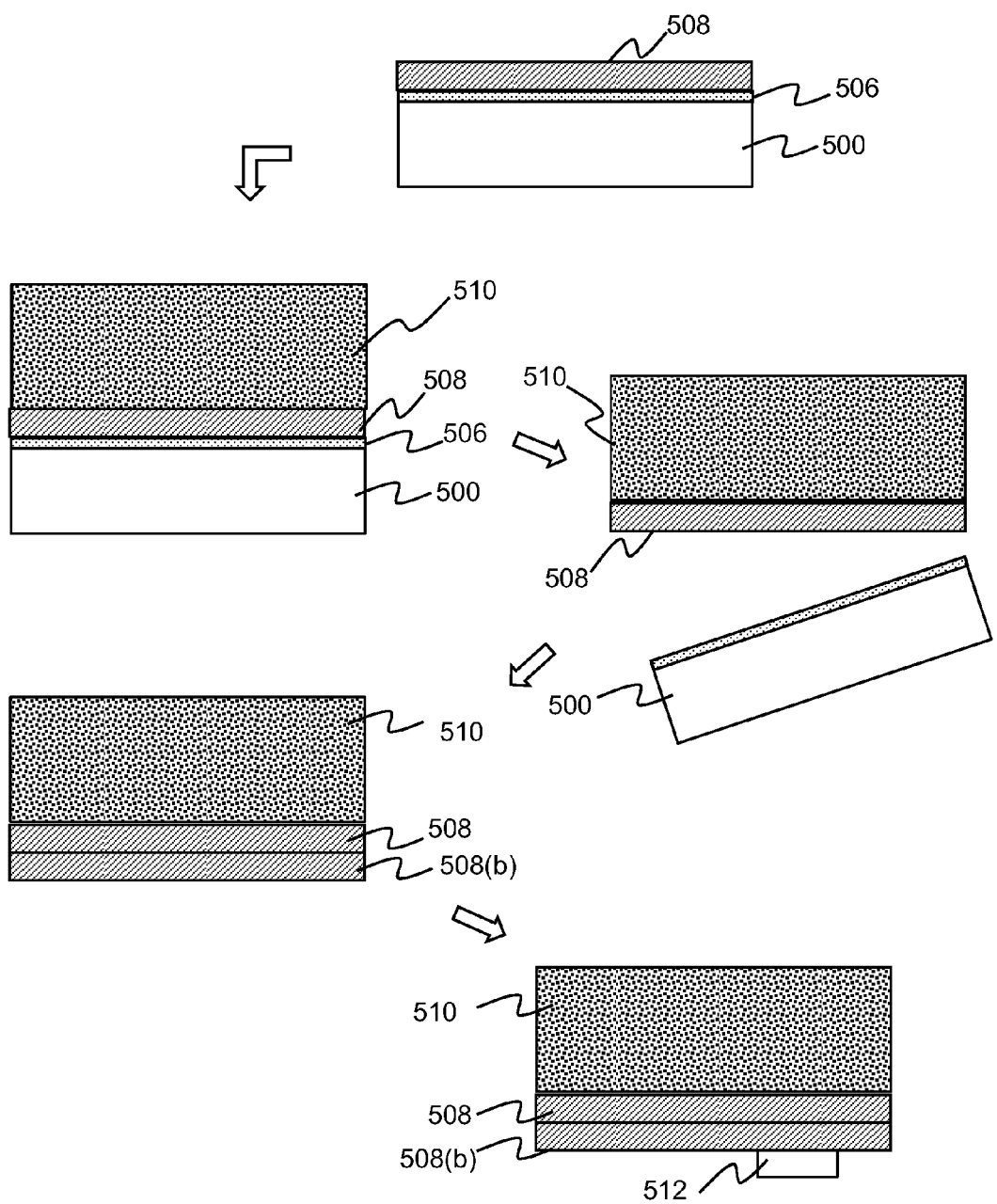
FIG. 5 is a diagrammatic representation of a device and methods of preparing a device from an epitaxial transfer layer.
Figure 6:
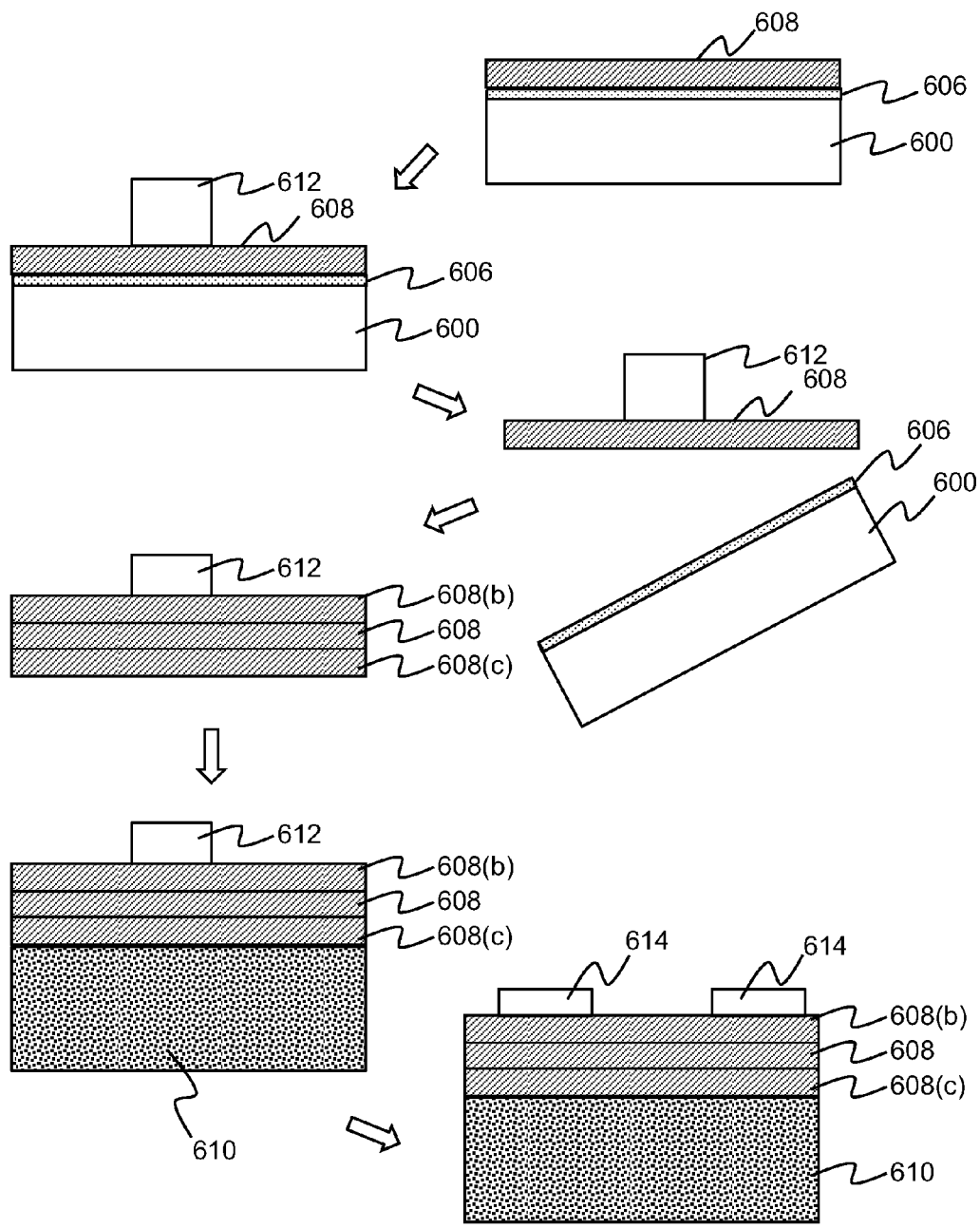
FIG. 6 is a diagrammatic representation of a device and methods of preparing a device from an epitaxial transfer layer.
Figure 7:
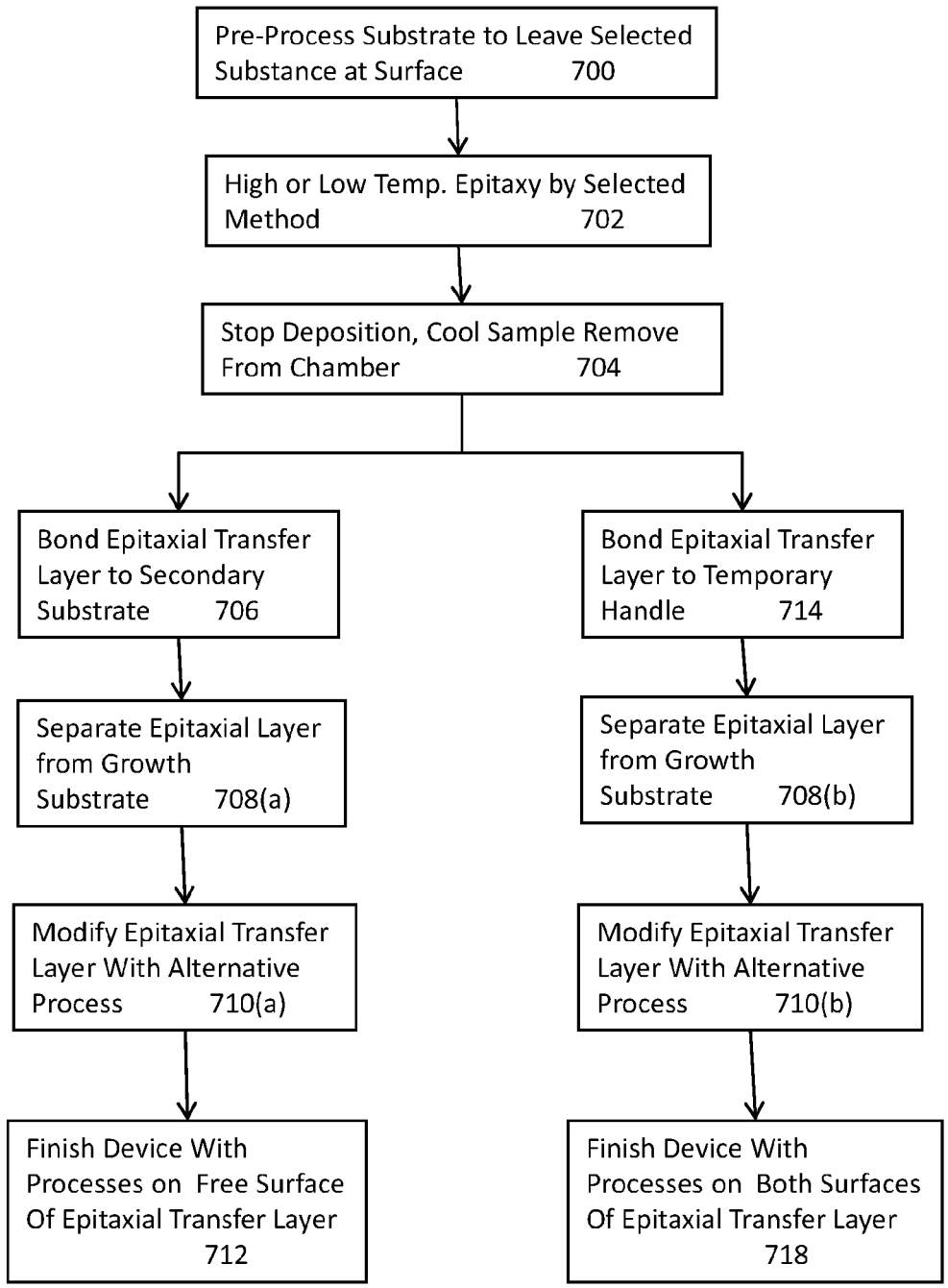
FIG. 7 is a flow chart illustrating methods of preparing an epitaxial transfer layer and preparing a device using the epitaxial transfer layer.

The film of crystalline silicon prepared as described above may be used to fabricate semiconductor devices. Thin films of crystalline silicon may be used in the fabrication of devices including, but not limited to, photovoltaic cells, integrated circuit devices, photonic devices, piezoelectric devices, micro-electromechanical systems, sensors, actuators, flat panel displays and similar devices and apparatus. FIGS. 4 and 7 are simplified flowcharts illustrating alternative methods of fabricating a device. In particular, FIG. 4 details one of many alternative processes for the preparation and use of an epitaxial transfer layer grown using low temperature HWCVD on a silicon substrate having a hydrogen terminated surface. FIGS. 5 and 6 are diagrams illustrating the fabrication of a device according to the method of FIG. 4. The substrate, for example substrate 500 of FIG. 5, may initially be prepared by removing the native oxide layer from an exterior surface using liquid HF or another suitable technique which leaves a hydrogen terminated surface 506 (step 400 of FIG. 4). The substrate typically will be a crystalline silicon wafer but may be implemented with any suitable silicon substrate having any shape or desired surface characteristics. The substrate may be heated to a suitable deposition temperature of less than 550° C. For example, the substrate may be heated to approximately 400° C. (step 402). Thereafter HWCVD may be used to deposit epitaxial silicon 508 from a suitable vapor such as silane ($SiH_4$) or disilane ($Si_2H$) on to the substrate (step 404). Since the deposition temperature was maintained suitably low, an interface defining substance 506 of hydrogen, carbon, oxygen or another substance will remain at the interface. Upon the growth of a suitably thick epitaxial silicon layer 508 deposition may be stopped, the sample cooled and removed from the deposition chamber (step 406). Thereupon the outer epitaxial surface may be bonded to a secondary substrate 510 (step 408). The secondary substrate will typically be a durable, workable substrate having properties suitable for the intended device. In addition, the secondary substrate will typically but not necessarily be a less expensive material than crystalline silicon. Representative examples of a secondary substrate include, but are not limited to, borosilicate glass, float glass coated with a layer of $SiO_2$, plastics, ceramics or any other suitable substrate material.

After bonding the epitaxial layer 508 to a secondary substrate 510 the epitaxial layer 508 may be released from the silicon growth substrate 500 at the hydrogen interface 506 (step 410). As described above, known cleaving techniques and processes may be used to release the epitaxial layer including, but not limited to, the application of mechanical, optical or thermal energy to the interface. The substrate 500 may be re-used in this fashion many times.

Upon release from the growth substrate 500 the transferred epitaxial layer 508 may be modified (step 412). For example, the epitaxial layer may optionally be thickened or overcoated with a higher temperature epitaxy process to achieve a thicker epitaxial layer 508(*b*) while avoiding epitaxy failure. The transferred epitaxial layer 508 or modified layer 508(*b*) may be doped with any suitable dopant including, but not limited to, boron, phosphorous, aluminum or arsenic. Subsequent crystalline or amorphous silicon layers may be applied or grown on the transferred epitaxial layer by known processes.

When the transferred epitaxial layer 508 has been suitably modified as described above a device may be finished upon the epitaxial layer 508 or modified layers 508(*b*) (step 414). For example, contact regions 512 may be formed by metal contact deposition. Any other suitable finishing step may be implemented on the structure prepared as described above.

As is also illustrated in FIG. 4 in conjunction with FIG. 6, a crystalline silicon layer 608 grown as described above may be separated from the crystalline silicon growth matrix 600 and processed before the transferred layer 608 is associated with a secondary matrix 610. For example, the epitaxial transfer layer 608 may be bonded to a temporary handle 612 after the matrix and epitaxial layer are removed from the deposition chamber and cooled (step 416). Thereupon, the epitaxial transfer layer 608 may be released or separated from the matrix at the hydrogen interface (step 410(*b*)). The epitaxial transfer layer 608 may then be modified, for example thickened, overcoated (resulting in layers 608(*b*) and 608(*c*)), or doped with access to both sides of the transfer layer (step 412(*b*)). Similarly, finishing processes such as the deposition of a metal contact 614 may be performed with access to both sides of the transfer layer (step 418). The finished layer may then be bonded to or otherwise associated with a suitable secondary matrix 610 (step 418).

Processing methods which include the use of a matrix having a hydrogen terminated surface such as those described above with respect to FIGS. 4-6, are initially limited to lower temperature epitaxial processes to avoid expelling the hydrogen termination of the substrate surface before epitaxial growth commences. In an alternative method, the interface defining substance 106 incorporated at the interface between the substrate and epitaxial layer could be an element or substance other than hydrogen, for example carbon, oxygen a hydrocarbon or water. The element or substance defining the interface may be intentionally or unintentionally as a consequence of atmospheric exposure associated with the substrate surface upon which epitaxial growth will occur (see FIG. 7, step 700). Any interface defining substance 106 which will add stress or reduce the fracture energy along the interface plane between the substrate and epitaxial layer without disrupting epitaxial deposition may be suitable for implementation of the methods described herein. Certain selected interface defining substances 106 may resist being expelled at higher temperatures allowing for growth of an epitaxial transfer layer by various higher temperature growth processes (step 702). Thereupon, deposition may be stopped, the sample cooled and removed from the chamber (step 704). After removal from the chamber, the epitaxial transfer layer may be processed by any of the methods described above. For example, the epitaxial layer may be bonded to a secondary substrate, separated from the growth substrate and processed as desired (steps 706-712). Alternatively, the epitaxial transfer layer may be bonded to a temporary handle, processed and finished as desired (steps 716-718).

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method of preparing a crystalline silicon film comprising:
   providing a non-porous, non-ion-implanted silicon growth substrate;
   associating an interface defining substance which is not silicon with an exterior surface of the silicon growth substrate;
   depositing at a low temperature an epitaxial layer of silicon on the exterior surface of the silicon growth substrate, wherein the low temperature is less than or equal to about 550° C.;
   separating the epitaxial layer from the substrate along a cleavage plane defined by the interface defining substance which is substantially co-planar with the exterior surface of the silicon growth substrate; and
   reusing the substrate for the production of at least one additional crystalline silicon film after the separating.

2. The method of claim 1 further comprising associating the epitaxial layer with a secondary substrate.

3. The method of claim 2 wherein the epitaxial layer is associated with the secondary substrate prior to separating the epitaxial layer from the growth substrate.

4. The method of claim 2 wherein the epitaxial layer is associated with a temporary handle prior to separating the epitaxial layer from the growth substrate.

5. The method of claim 2 wherein the secondary substrate is a glass substrate.

6. The method of claim 1 wherein the interface defining substance comprises at least one of a hydrogen terminated surface, carbon, oxygen, a hydrocarbon, or water.

7. The method of claim 1 further comprising:
   initially depositing the epitaxial layer at the low temperature of equal to or less than 550° C.; and
   subsequently depositing the epitaxial layer at a temperature greater than the low temperature.

8. The method of claim 1 further comprising depositing an amorphous silicon layer on the epitaxial layer.

9. The method of claim 1 wherein the low temperature depositing of the epitaxial layer is by hot wire chemical vapor deposition.

10. The method of claim 1 wherein the low temperature depositing of the epitaxial layer is by remote plasma chemical vapor deposition.

11. The method of claim 1 further comprising doping the epitaxial layer with a dopant.

12. The method of claim 11 wherein the dopant is selected from a group consisting of boron, phosphorous, aluminum, and arsenic.

13. The method of claim 1 wherein the epitaxial layer has a surface roughness at the exterior surface which was separated from the silicon growth substrate which is sufficiently smooth for use without additional surface smoothing.

14. The method of claim 1, wherein the low temperature is less than about 480° C.

15. The method of claim 1, wherein the substrate has a surface roughness of less than or equal to about 4.0 nm, wherein the surface roughness is substantially unaffected by the separation.

16. A method of fabricating a silicon based device comprising:
   providing a non-porous, non-ion-implanted silicon growth substrate;
   associating an interface defining substance which is not silicon with an exterior surface of the silicon growth substrate;
   depositing at a low temperature an epitaxial layer of silicon on the exterior surface of the silicon growth substrate, wherein the low temperature is less than or equal to about 550° C.;
   separating the epitaxial layer from the growth substrate at a cleavage plane defined by the interface defining substance which is substantially co-planar with the exterior surface of the silicon growth substrate;
   associating the epitaxial layer with a secondary substrate;
   processing the epitaxial layer; and
   reusing the silicon growth substrate for the production of at least one additional crystalline silicon film after the separating.

17. The method of claim 16 wherein the epitaxial layer is processed before it is separated from the silicon growth substrate.

18. The method of claim 16 wherein the epitaxial layer is processed after it is separated from the silicon growth substrate.

19. The method of claim 16, wherein the low temperature depositing is by hot wire chemical vapor deposition.

20. The method of claim 16, wherein the low temperature is less than about 480° C.

21. The method of claim 16, wherein the silicon growth substrate has a surface roughness of less than or equal to about 4.0 nm, wherein the surface roughness is substantially unaffected by the separation.

* * * * *